(12) United States Patent
Lee et al.

(10) Patent No.: US 9,257,581 B2
(45) Date of Patent: Feb. 9, 2016

(54) INTEGRATED IMAGE SENSOR

(71) Applicant: Taiwan Semiconductor Manufacturing Co., Ltd., Hsin-Chu (TW)

(72) Inventors: En-Ting Lee, Kaohsiung (TW); Kun-El Chen, Beimen Township (TW); Yu-Sheng Wang, Tainan (TW); Chien-Chung Chen, Kaohsiung (TW); Huai-Tei Yang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/291,076

(22) Filed: May 30, 2014

(65) Prior Publication Data
US 2014/0264707 A1 Sep. 18, 2014

Related U.S. Application Data

(62) Division of application No. 13/396,870, filed on Feb. 15, 2012, now Pat. No. 8,748,315.

(51) Int. Cl.
| | |
|---|---|
| *H01L 27/146* | (2006.01) |
| *H01L 31/0352* | (2006.01) |
| *H01L 27/144* | (2006.01) |
| *H01L 21/265* | (2006.01) |

(52) U.S. Cl.
CPC ........ *H01L 31/0352* (2013.01); *H01L 27/1446* (2013.01); *H01L 27/1464* (2013.01); *H01L 27/14643* (2013.01); *H01L 27/14687* (2013.01); *H01L 21/26513* (2013.01)

(58) Field of Classification Search
CPC .................................................. H01L 27/1464
See application file for complete search history.

(56) References Cited

U.S. PATENT DOCUMENTS

| 6,306,710 B1 | 10/2001 | Long et al. |
|---|---|---|
| 8,304,354 B2 | 11/2012 | Hsu et al. |

(Continued)

OTHER PUBLICATIONS

Paul Jerram, et al., "Back-Thinned CMOS Sensor Optimisation", e2v Technologies, SPIE Proceeding 7598, 2010.

(Continued)

*Primary Examiner* — Victor A Mandala
*Assistant Examiner* — Regan J Rundio
(74) *Attorney, Agent, or Firm* — Eschweiler & Associates, LLC

(57) ABSTRACT

The present disclosure relates to a back-side illuminated CMOS image sensor (BSI CIS). In some embodiments, the BSI CSI has a semiconductor substrate with a front-side and a back-side. A plurality of photodetectors are located within the front-side of the semiconductor substrate. An implantation region is located within the semiconductor substrate at a position separated from the plurality of photodetectors. The implantation region is disposed below the plurality of photodetectors and has a non-uniform doping concentration along a lateral plane parallel to the back-side of the semiconductor substrate. The non-uniform doping concentration allows for the BSI CSI to achieve a small total thickness variation (TTV) between one or more photodetectors and a back-side of a thinned semiconductor substrate that provides for good device performance.

20 Claims, 8 Drawing Sheets

(56) References Cited

U.S. PATENT DOCUMENTS

| | | | |
|---|---|---|---|
| 2002/0139970 | A1 | 10/2002 | Iwanczyk et al. |
| 2009/0233428 | A1 | 9/2009 | Seacrist |
| 2009/0298260 | A1* | 12/2009 | Zhu et al. ............ 438/458 |
| 2010/0013039 | A1 | 1/2010 | Qian et al. |
| 2010/0116971 | A1* | 5/2010 | McCarten et al. ...... 250/214.1 |
| 2011/0108940 | A1 | 5/2011 | Huang et al. |
| 2011/0136267 | A1 | 6/2011 | Morital et al. |
| 2011/0140220 | A1 | 6/2011 | Marty et al. |
| 2011/0260221 | A1 | 10/2011 | Mao et al. |
| 2012/0264307 | A1 | 10/2012 | Kundalgurki et al. |

OTHER PUBLICATIONS

Richard D. Crisp, et al., "Back-illuminated CMOS Image Sensors Come to the Fore", Qioptiq photonics for Innovation, May 2010.

Non-Final Office Action dated Feb. 20, 2013 for U.S. Appl. No. 13/396,870.

Non-Final Office Action dated Jun. 18, 2013 for U.S. Appl. No. 13/396,870.

Notice of Allowance dated Jan. 29, 2014 for U.S. Appl. No. 13/396,870.

* cited by examiner

INTEGRATED IMAGE SENSOR

REFERENCE TO RELATED APPLICATION

This application is a divisional of U.S. application Ser. No. 13/396,870 filed on Feb. 15, 2012.

BACKGROUND

CMOS image sensors are widely used in many modern day electronic devices to convert an optical image to an electric signal. A CMOS image sensor can be fabricated as a back-side illuminated or as a front-side illuminated CMOS image sensor. Back-side illuminated CMOS image sensors, which receive light on a back-side of a workpiece, offer superior performance (e.g., high resolution) over front-side illuminated CMOS image sensors.

Light incident on a back-side of a thinned semiconductor substrate, travels through a thin layer of semiconductor material to a plurality of photodetectors located within a front-side of the semiconductor substrate. The incident light generates carriers within the photodetectors which are transferred to back-end metal wiring levels that provide the carriers as an electric signal to a signal processing unit.

DETAILED DESCRIPTION

Figure 1A:
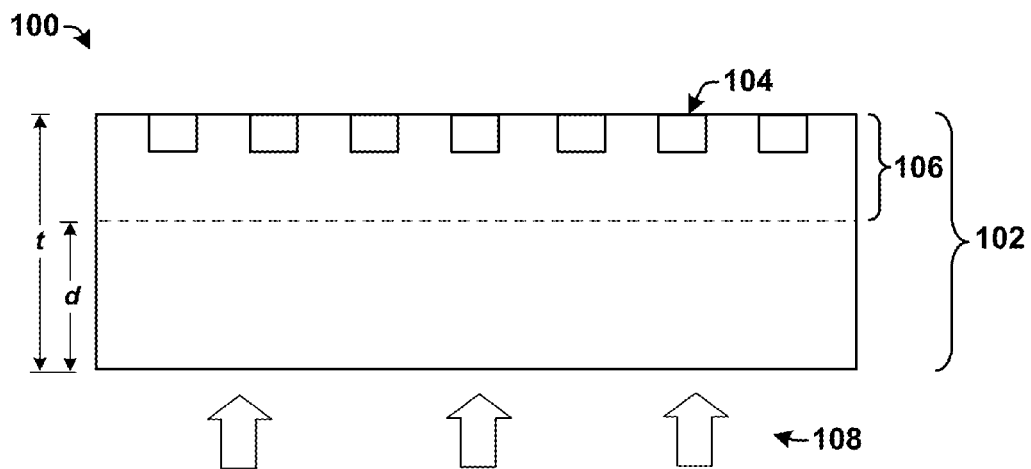
FIGS. 1A-1B illustrate cross-sectional views of the formation of a conventional back-side illuminated CMOS image sensor.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

FIG. 1A illustrates a cross-sectional view 100 of the formation of a conventional back-side illuminated CMOS image sensor (BSI CIS). During formation of the conventional BSI CIS, a back-side of a semiconductor substrate 102 is etched by an etchant 108 to reduce the original thickness t of the semiconductor substrate 102 by a thickness of d, resulting in a thinned semiconductor substrate 106 having a relatively small thickness. The thinned semiconductor substrate 106 comprises a plurality of photodetectors 104, which are positioned within a front-side of the thinned semiconductor substrate 106.

Figure 1B:
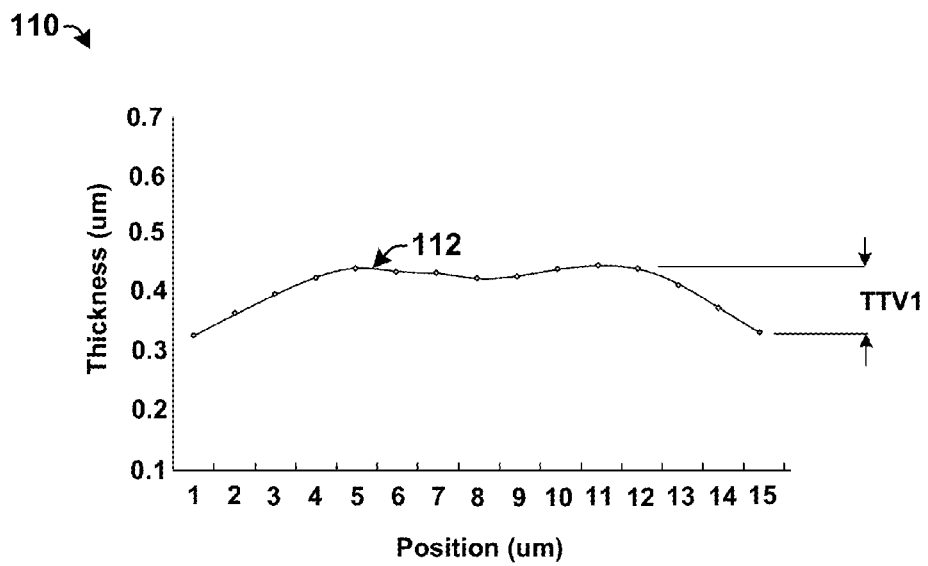

The thinned semiconductor substrate 106 has a thickness (t−d) that allows for light incident on the back-side of the thinned semiconductor substrate 106 to penetrate through the thinned semiconductor substrate 106 to the photodetectors 104. Therefore, the uniformity of substrate thinning achieved by etchant 108 must be extremely precise since excess silicon on the back-side of the thinned semiconductor substrate 106 acts as a barrier to light. FIG. 1B is a graph 110 showing a trend line 112 corresponding to the etchant depth as a function of position on the back-side of the semiconductor substrate 102. The etchant depth is greater in the center of the substrate 102 than at the edges, resulting in a total thickness variation TTV1 of approximately 0.1 μm over the back-side of the thinned semiconductor substrate 106.

Figure 1C:
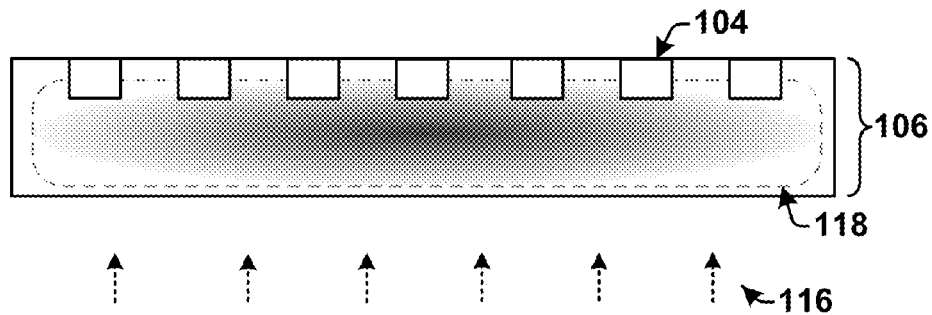
FIG. 1C is a graph showing a total thickness variation over the back-side of a conventional back-side illuminated CMOS image sensor.

After etching is performed to form the thinned semiconductor substrate 106, the back-side of the thinned semiconductor substrate 106 is subjected to an implant 116 that forms an implantation region 118 within the thinned semiconductor substrate 106, as shown in cross-sectional view 114 of FIG. 1C. However, the implant 116 cannot be tightly controlled and results in an implantation region 118 that comes into contact with the plurality of photodetectors 104, causing degradation of the performance of the plurality of photodetectors 104.

Accordingly, some aspects of the present disclosure provide for a method of forming a back-side illuminated CMOS image sensor (BCI CIS) with improved device performance and a small total thickness variation (TTV) between one or more photodetectors and a back-side of a thinned semiconductor substrate, and an associated apparatus. In some embodiments, the method comprises forming a plurality of photodetectors within a front-side of a semiconductor substrate. An implant is performed on the back-side of the semiconductor substrate to form an implantation region having a non-uniform doping concentration. The back-side of the semiconductor substrate is then exposed to an etchant, having an etch rate that is inversely proportional to the doping concentration, which thins the semiconductor substrate to a thickness that allows for light to pass through the back-side of the semiconductor substrate to the plurality of photodetectors. By implanting the semiconductor substrate prior to etching, the uniformity of the etching rate can be improved over the back-side of the substrate, thereby improving TTV.

Figure 2:
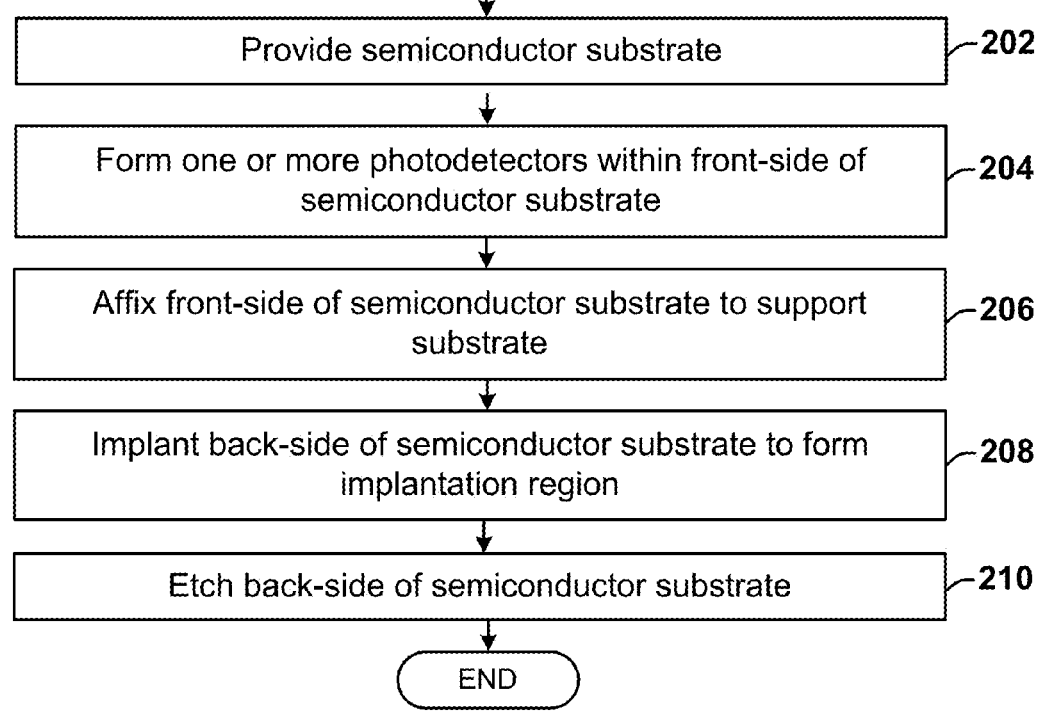
FIG. 2 is a flow diagram illustrating some embodiments of an exemplary method for forming a disclosed back-side illuminated CMOS image sensor.

FIG. 2 is a flow diagram illustrating some embodiment of an exemplary method 200 for forming a disclosed a back-side illuminated CMOS image sensor (BSI CIS). The method 200 performs an implant on a back-side of a semiconductor substrate prior to performing an etch on the back-side, to reduce the thickness of (i.e., thin) the semiconductor substrate. Since the etch rate is a function of the doping concentration, the total thickness variation over the back-side of the semiconductor substrate can be reduced.

While the method 200 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 202 a semiconductor substrate is provided. In some embodiments, the semiconductor substrate comprises a bulk substrate having a first dopant type (e.g., an n-type dopant).

At step 204 one or more photodetectors are formed within a front-side of the semiconductor substrate. The one or more photodetectors may comprise pinned diodes formed by masking the semiconductor substrate and then selectively implanting the semiconductor substrate with a first implant (e.g., a p-type implant) followed by a shallow, second implant (e.g., an n-type implant) aligned with the first implant.

At step 206 the front-side of the semiconductor substrate is affixed to a support substrate.

At step 208 an implant is performed on the back-side of the semiconductor substrate. The implant may comprise a second dopant type (e.g., a p-type dopant) such as boron, for example. The implant forms an implantation region. In some embodiments, the implantation region comprises a doping concentration profile that decreases as a function of the distance from a center of the semiconductor substrate. This provides for a higher doping concentration at the center of the semiconductor substrate than at edges of the semiconductor substrate (i.e., the doping concentration is proportional to the radial distance from the center of implantation region).

At step 210 the back-side of the semiconductor substrate is etched. Etching the back-side of the semiconductor substrate reduces the thickness of the semiconductor substrate to form a thinned semiconductor substrate having a thickness that allows for light to pass through the back-side of the thinned semiconductor substrate to the plurality of photodetectors. The etch has an etch rate that is a function of the doping concentration of the implantation region, such that by performing the implant (step 208) prior to the etch (step 210) the doping concentration profile can be used to decrease total thickness variation over the back-side of the semiconductor substrate.

In some embodiments, the etch is performed using an etchant having an etch rate that is inversely proportional to the doping concentration of the implantation region. For example, in some embodiments the etchant comprises Tetramethylammonium hydroxide (TMAH). Since the etch rate is inversely proportional to the doping concentration, areas having a higher doping concentration will have an etch rate that is decreased by a greater amount than areas having a lower doping concentration. By doping the back-side of the semiconductor substrate to have a greater doping concentration at the center of the substrate than at the edge (e.g., a Gaussian doping concentration), the natural variation in etching rates (e.g., shown in FIG. 1B) is offset by changes in etch rate caused by the implant. This offset results in a lower TTV variation over the back-side of the semiconductor substrate.

Figure 3A:
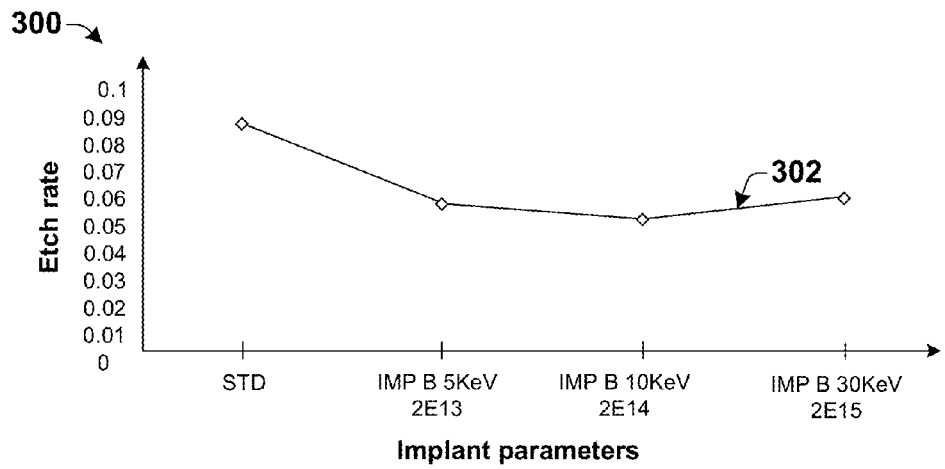
FIG. 3A is a graph showing some embodiments of an exemplary etching rate as a function of implantation parameters.

For example, FIG. 3A illustrates a graph 300 showing a trend line 302 corresponding to the etch rate of a silicon substrate for different implant doses and energies. As shown in FIG. 3A, the etch rate of the silicon substrate decreases as the implant dose (and doping concentration within the substrate) increases. For example, the average etching rate of silicon without an implantation region is approximately 0.09 µm/min. The etch rate decreases to approximately 0.06 µm/min for an implantation region formed with a 5 KeV implant having a dose of $2 \times 10^{13}$ cm$^{-2}$ and to 0.055 µm/min for an implantation region formed with a 10 KeV implant having a dose of $2 \times 10^{14}$ cm$^{-2}$. In other words, increasing the doping concentration decreases the etch rate.

It will be appreciated that the implant can be performed over a wide range of energy and dose. In some embodiments, the implant can be performed using a dose in a range from about $1 \times 10^{13}$ cm$^{-2}$ to about $1 \times 10^{16}$ cm$^{-2}$ and having an energy in a range from about 5 Kev to about 30 Kev, for example. In other embodiments, the energy and dose of the implant may be greater than or less than the above disclosed values.

Figure 3B:
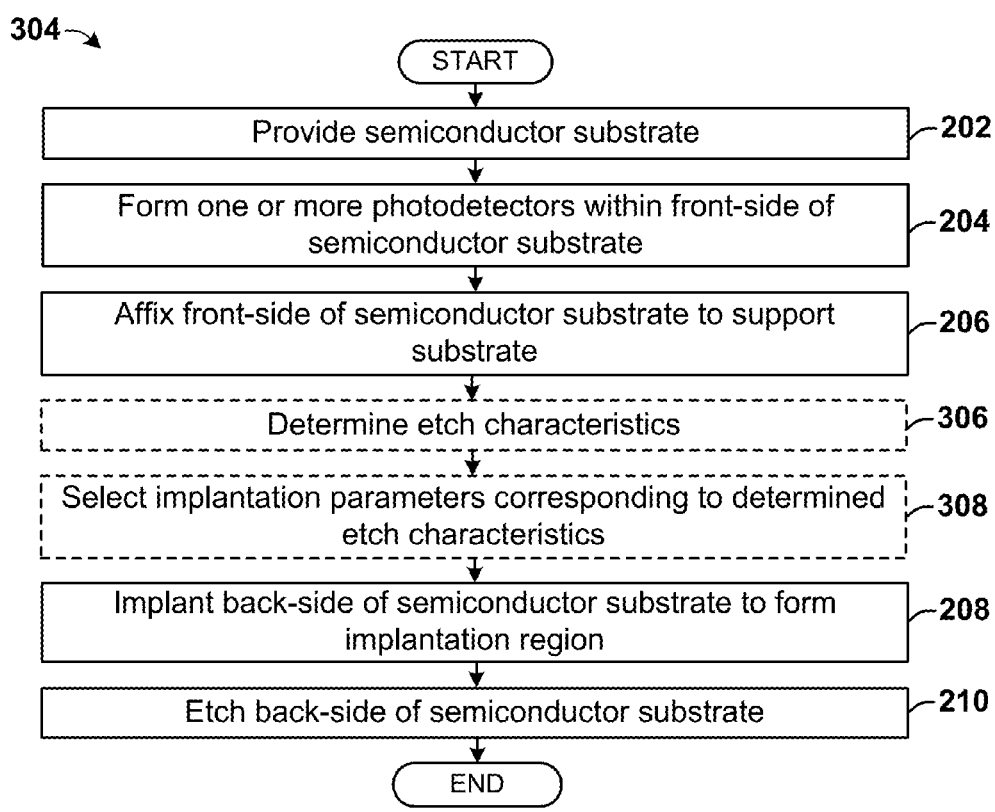
FIG. 3B is a flow diagram illustrating some alternative embodiments of an exemplary method for forming a disclosed back-side illuminated CMOS image sensor.

In some embodiments, the implant can be varied to tune etching characteristics (e.g., etch rate, etch depth, etc.) of the substrate, since etch rate is a function of the doping concentration. For example, FIG. 3B is a flow diagram illustrating some embodiment of an exemplary method 304 for forming a disclosed a back-side illuminated CMOS image sensor (BSI CIS). Method 304 is similar to method 200, but further comprises steps of determining etch characteristics (step 306) and selecting implant parameters corresponding to the determined etch characteristics (step 308). The etch characteristics may comprise etch rate, etch depth, etc. The implant parameters may comprise implant dose, implant energy, implant species, etc.

For example, in some embodiments the depth of the implant can selectively controlled to control a distance between the photodetectors and the back-side of a semiconductor substrate. For example, using a higher implant energy drives dopants to a greater depth within the semiconductor substrate, causing the etch to proceed deeper into the substrate before it is slowed by the high doping concentrations. Similarly, the total thickness variation can be controlled by increasing or decreasing the dose of the implant to change the variation in etch rate between different locations on the back-side of the substrate.

Some embodiments of an exemplary semiconductor substrate, whereon a method for forming a CBS CIS (e.g., method 200 and/or 304) is implemented, are illustrated in cross-sectional views of FIGS. 4-8.

Figure 4:
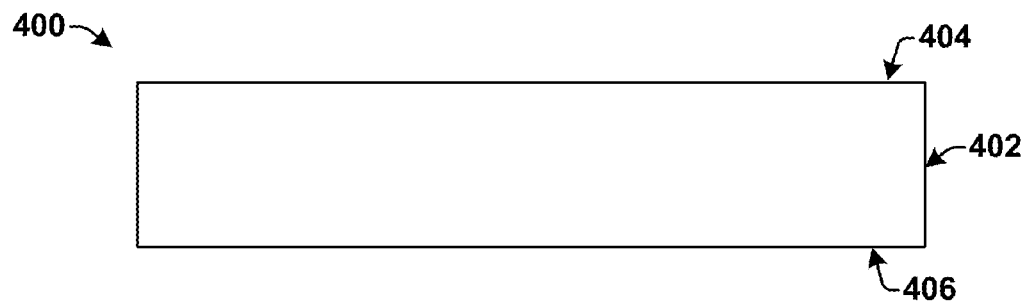
FIGS. 4-8 are cross-sectional views of some embodiments of an exemplary semiconductor substrate upon which a method of forming a back-side illuminated CMOS image sensor is performed.

FIG. 4 illustrates a cross-sectional view 400 of a semiconductor substrate 402. The semiconductor substrate 402 has a front-side 404 and a back-side 406. The semiconductor substrate 402 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. Furthermore, the additional and/or different processing steps may occur prior to operation of method 200 or 304.

Figure 5:
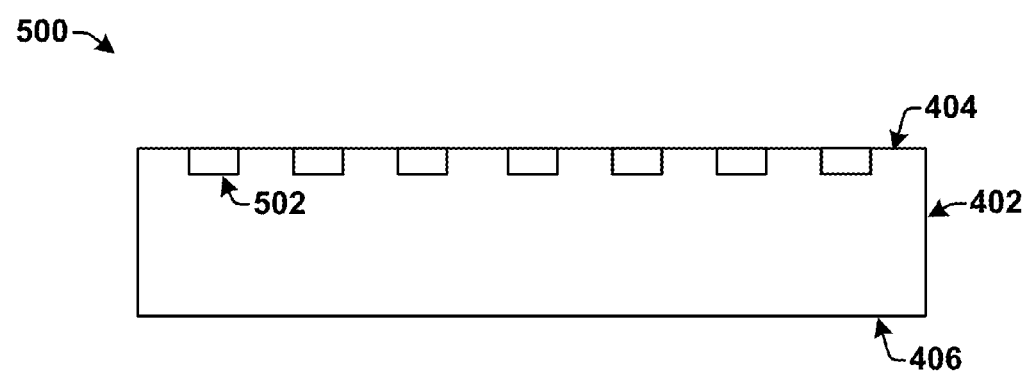

FIG. 5 illustrates a cross-sectional view 500 of one or more photodetectors 502 formed within the semiconductor substrate 402. The one or more photodetectors 502 are formed within the front-side 404 of the semiconductor substrate 402. In some embodiments, the photodetectors 502 comprise pinned photodiodes, for example.

Figure 6:
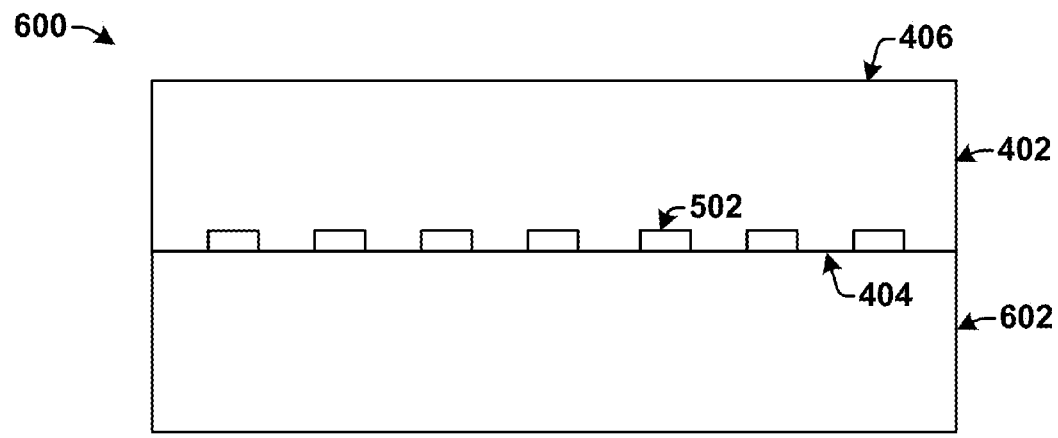

FIG. 6 illustrates a cross-sectional view 600 of the semiconductor substrate 402 affixed to a support substrate 602. The support substrate 602 may comprise a silicon substrate, for example. The semiconductor substrate 402 is placed face-down so that the front-side 404 of the semiconductor substrate 402 is affixed to the support substrate 602. In various embodiments, the semiconductor substrate 402 can be affixed to the support substrate by using a dilute adhesive or by molecular bonding, for example.

Figure 7A:
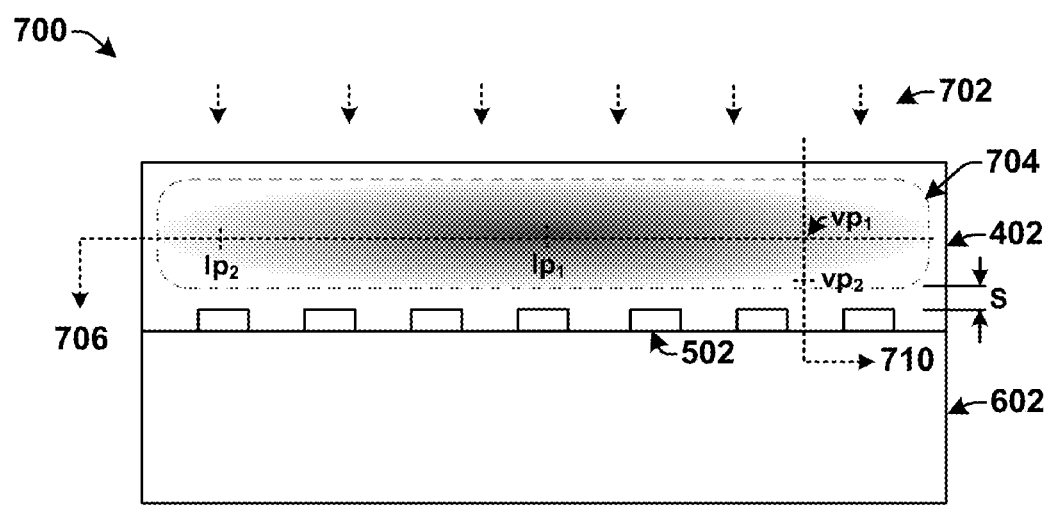

FIG. 7A illustrates a cross-sectional view 700 of the semiconductor substrate being subjected to an implant 702 that forms an implantation region 704. The implantation region 704 is formed by implanting dopants into the back-side 406 of the semiconductor substrate 402. The dopants comprise boron dopants in some embodiments. In some embodiments, the resulting implantation region 704 is separated from the photodetectors 502 by a spacing S.

Figure 7B:
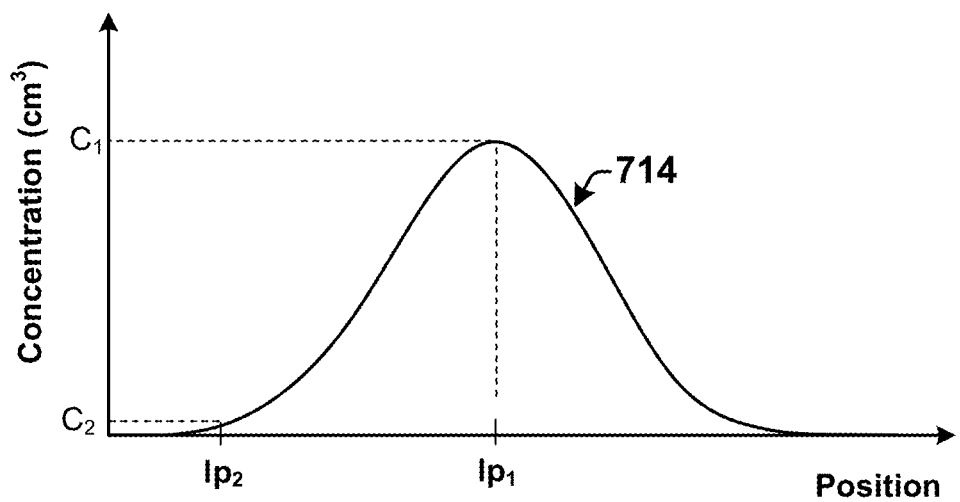

FIG. 7B is a graph 712 showing a trend line 714 corresponding to a lateral doping concentration profile (cross-section 706 in FIG. 7A) of the semiconductor substrate 402 as a function of position. The doping concentration profile comprises a Gaussian distribution, such that the doping concentration is higher in the center of the substrate compared to the edges of the substrate. For example, at a first lateral location $Ip_1$, the doping concentration profile has a first doping concentration $C_1$, while at a second lateral location $Ip_2$ the doping profile has a second doping concentration $C_2$ that is lower than the first doping concentration $C_1$. In some embodiments, the mean and variance of the doping concentration profile can be varied by changing implant parameters to change the rate at which different regions on the back-side 406 of the semiconductor substrate 402 are etched.

Figure 7C:
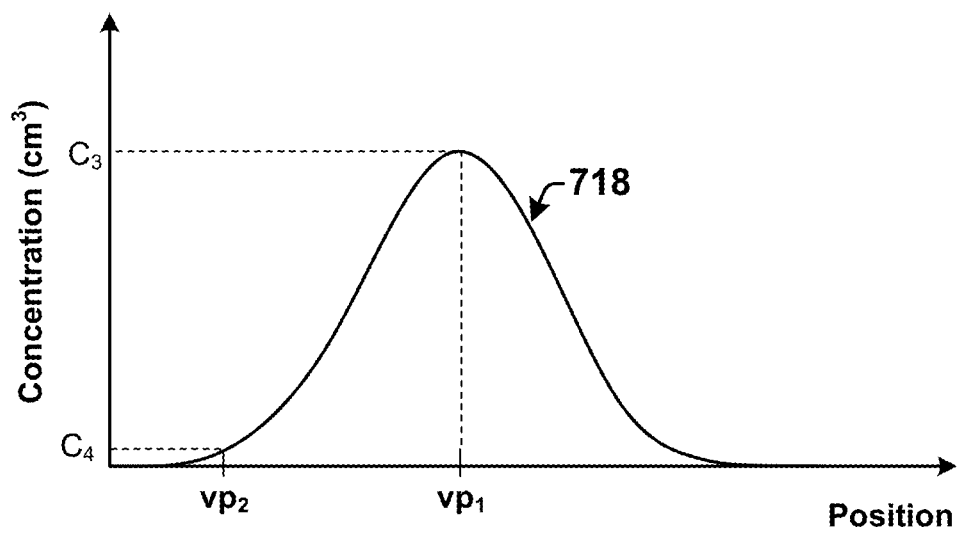

In some embodiments, the doping concentration profile may also be controlled in the vertical direction to control the resulting etching depth and device performance parameters. FIG. 7C is a graph 716 showing a trend line 718 corresponding to a vertical doping concentration profile (cross-section 710 in FIG. 7A) of the semiconductor substrate 402 as a function of position. As shown in graph 716, the vertical doping concentration varies between the back-side 406 of the semiconductor substrate 402 and the photodetectors 502. For example, at a first vertical location $vp_1$, the doping concentration profile has a third doping concentration $C_3$, while at a second vertical location $vp_2$ the doping profile has a fourth doping concentration $C_4$ that is lower than the third doping concentration $C_3$.

In some embodiments, the implant energy can be chosen to form an implantation region 704 configured to extend within the semiconductor substrate 402 to a depth that spatially separates the implantation region 704 and the photodetectors 502 from one another. By separating the implantation region from the photodetectors 502, the performance of the photodetectors is improved.

In additional embodiments, the location of a peak in the vertical doping concentration can be controlled by changing the implant energy. By changing the location of the peak of the vertical doping concentration, the location of an effective etch stop layer defined by the peak can be changed within the semiconductor substrate 402. For example, as shown in graph 716 a peak of the vertical doping concentration is located at the first vertical location $vp_1$. Since the etch rate at the peak is the lowest, the etch can be effectively stopped at a vertical position corresponding to the peak (e.g., at location $vp_1$).

Figure 8:
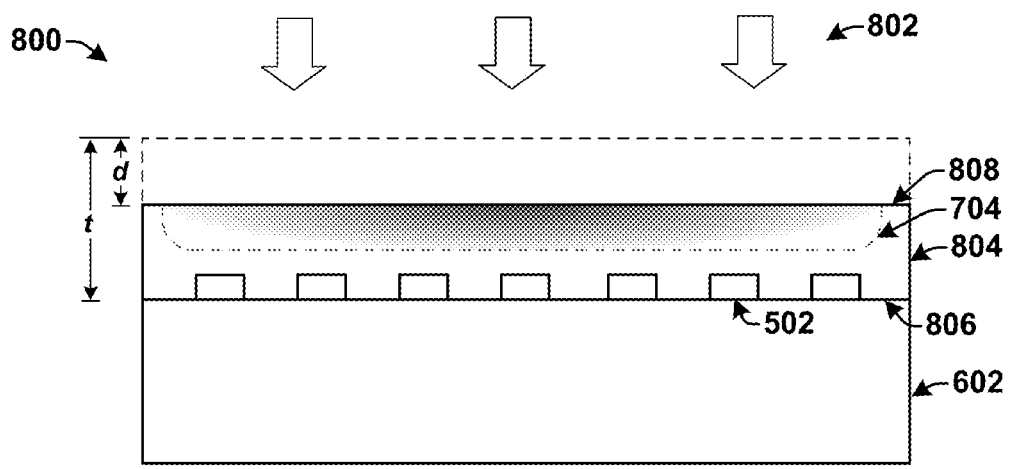

FIG. 8 illustrates a cross-sectional view 800 of a semiconductor substrate exposed to an etchant 802. The etchant 802 is configured to remove silicon from a back-side 808 of the semiconductor substrate (e.g., semiconductor substrate 402 of FIG. 7A) to form a thinned semiconductor substrate 804, having a thickness that is sufficiently thin to allow light to pass through the back-side 808 of the thinned semiconductor substrate 804 to the plurality of photodetectors 502 within a front-side 806 of the thinned semiconductor substrate 804. In some embodiments, the etchant 802 is configured to reduce the thickness of the semiconductor substrate by a distance d of approximately 0.7 μm, from a thickness t of approximately 3 μm to a thickness t–d of approximately 2.3 μm.

Figure 9:
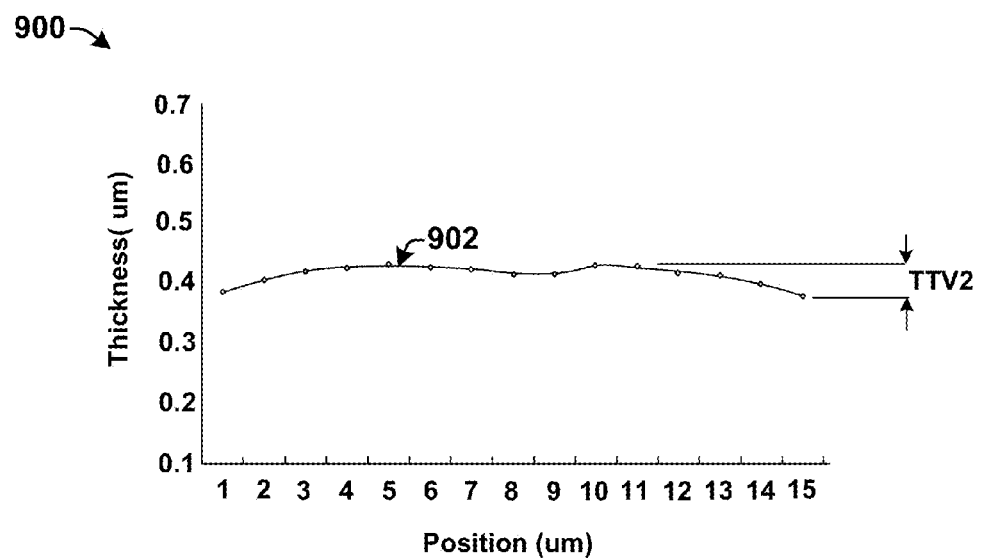
FIG. 9 is a graph showing a total thickness variation over the back-side of a disclosed back-side illuminated CMOS image sensor.

FIG. 9 is a graph 900 showing a trend line 902 corresponding to a total thickness variation of the back-side of a disclosed back-side illuminated CMOS image sensor. The implantation region has a doping concentration that reduces the etchant depth in the center of the substrate (e.g., compared to the graph 110 of FIG. 1B), resulting in a total thickness variation TTV2 that is reduced due to the inverse relationship between the etching rate and the doping concentration. For example, a Gaussian distribution in the doping concentration provides for a higher doping concentration at the center of the semiconductor substrate than at the edge of the semiconductor substrate. Since the etch rate is inversely proportional to the doping concentration the etch rate at the center of the substrate is reduced, reducing the total thickness variation over the back-side of the substrate. In some embodiments, the total thickness variation can be reduced over conventional methods by up to 50% (e.g., from a value of TTV1=0.1 μm to a value of TTV2=0.05 μm).

Figure 10:
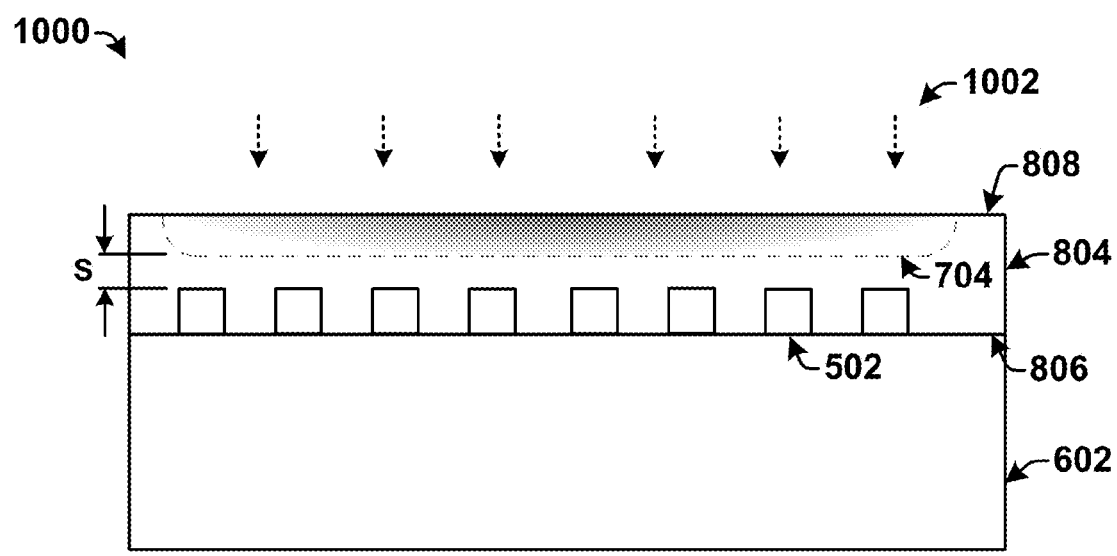
FIG. 10 illustrates a cross-sectional view of some embodiments of a back-side illuminated CMOS image sensor, as disclosed herein.

FIG. 10 illustrates a cross-sectional view of an embodiment of a back-side illuminated CMOS image sensor (BSI CSI) 1000, as disclosed herein.

The disclosed BSI CIS 1000 comprises a thinned semiconductor substrate 804 having a front-side 806 and a back-side 808. The front-side 806 of the thinned semiconductor substrate 804 comprises a plurality of photodetectors 502 and abuts a support substrate 602. The support substrate 602 is configured to provide mechanical support to the thinned semiconductor substrate 804. The back-side 808 of the thinned semiconductor substrate 804 is exposed to an external environment. In some embodiments, the thinned semiconductor substrate 804 is a bulk silicon substrate comprising a semiconductor material such as silicon, for example.

The thinned semiconductor substrate 804 comprises a thin layer of semiconductor material that separates the back-side 808 of the thinned semiconductor substrate 804 from the plurality of photodetectors 502. The thin layer of semiconductor material has a thickness that allows for visible light 1002 to penetrate through the back-side 808 of the thinned semiconductor substrate 804 to the plurality of photodetectors 502. The thin layer of semiconductor material has a relatively small total thickness variation (TTV) (i.e., a relatively small thickness difference between the maximum and minimum values of thickness) between the back-side 808 of the thinned semiconductor substrate 804 and the plurality of photodetectors 502. For example, the TTV may be approximately 0.05 μm.

The thinned semiconductor substrate 804 comprises an implantation region 704 located within the thin layer of semiconductor material that separates the back-side 808 of the thinned semiconductor substrate 804 and the plurality of photodetectors 502. The implantation region 704 is configured to reduce surface damage of the etch to improve performance of the plurality of photodetectors 502, for example by reducing recombination within the thinned semiconductor substrate 804 since etching the back-side 808 may increase concentration of generation-recombination centers that annihilate carriers generated within the thinned semiconductor substrate 804. In some embodiments, the thinned semiconductor substrate 804 comprises a first doping type (e.g., an n-type dopant) and the implantation region 704 comprises a second doping type (e.g., a p-type dopant type), having a doping concentration greater than that of the thinned semiconductor substrate 804.

Laterally, the doping concentration of the implantation region 704 is higher at the center of the thinned semiconductor substrate 804 than at the edges (i.e., the doping concentration is proportional to the radial distance from the center of implantation region). For example, the implantation region 704 may have a doping concentration with a Gaussian distribution. In some embodiments, the doping concentration vertically decreases from a peak doping concentration at the back-side 808 of the thinned semiconductor substrate 804 to a substantially zero doping concentration of the implantation region 704 at the photodetectors 502. In some embodiments, the implantation region 704 is separated from the photodetectors 502 by a distance S.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a back-side illuminated CMOS image sensor with a small total thickness variation (TTV) between one or more photodetectors and a back-side of a thinned semiconductor substrate that provides for good device performance.

In some embodiments, the present disclosure relates to a back-side illuminated CMOS image sensor (BSI CSI). The BSI CSI comprises a semiconductor substrate having a front-side and a back-side, and a plurality of photodetectors comprised within the front-side of the semiconductor substrate. The BSI CSI further comprises an implantation region located within the semiconductor substrate at a position separated from the plurality of photodetectors. The implantation region is disposed below the plurality of photodetectors and comprises a non-uniform doping concentration along a lateral plane parallel to the back-side of the semiconductor substrate.

In some other embodiments, the present disclosure relates to a back-side illuminated CMOS image sensor (BSI CSI). The BSI CSI comprises a semiconductor substrate having a front-side and a back-side, and a plurality of photodetectors comprised within the front-side of the semiconductor substrate. The BSI CSI further comprises an implantation region located within the semiconductor substrate at a position disposed between the plurality of photodetectors and the back-side of the semiconductor substrate and separated from the plurality of photodetectors. The implantation region comprises a non-uniform doping concentration that continuously extends below the plurality of photodetectors along a lateral plane parallel to the back-side of the semiconductor In yet other embodiments, the present disclosure relates to a back-side illuminated CMOS image sensor (BSI CSI). The BSI CSI comprises a semiconductor substrate having a front-side and a back-side, and a plurality of photodetectors comprised within the front-side of the semiconductor substrate. The BSI CSI further comprises an implantation region that continually extends below the plurality of photodetectors along a lateral plane parallel to the back-side of the semiconductor substrate and at a position vertically disposed between the plurality of photodetectors and the back-side of the semiconductor substrate. The implantation region has a non-uniform doping concentration that decreases as a function of radial distance from a center of the implantation region along the lateral plane.

What is claimed is:

1. A back-side illuminated CMOS image sensor (BSI CSI), comprising:
   a semiconductor substrate having a front-side and a back-side;
   a plurality of photodetectors comprised within the front-side of the semiconductor substrate; and
   an implantation region located within the semiconductor substrate at a position separated from the plurality of photodetectors, wherein the implantation region is disposed below the plurality of photodetectors and comprises a non-uniform doping concentration along a lateral plane parallel to the back-side of the semiconductor substrate.

2. The BSI CSI of claim 1, wherein the implantation region has a second non-uniform doping concentration along a vertical plane perpendicular to the lateral plane.

3. The BSI CSI of claim 1,
   wherein the semiconductor substrate has a first doping type; and
   wherein the implantation region has a second doping type different than the first doping type.

4. The BSI CSI of claim 3, wherein the first doping type comprises a p-type dopant and wherein the second doping type comprises an n-type dopant.

5. The BSI CSI of claim 1, wherein the semiconductor substrate comprises a bulk substrate.

6. The BSI CSI of claim 1, wherein the plurality of photodetectors are separated from the back-side of the semiconductor substrate by material of the semiconductor substrate having a thickness variation that is less than or equal to approximately 0.05 μm.

7. The BSI CSI of claim 1, wherein the non-uniform doping concentration of the implantation region comprises a Gaussian distribution along the lateral plane.

8. The BSI CSI of claim 1, wherein the plurality of photodetectors comprise pinned photodiodes.

9. A back-side illuminated CMOS image sensor (BSI CSI), comprising:
   a semiconductor substrate having a front-side and a back-side;
   a plurality of photodetectors comprised within the front-side of the semiconductor substrate; and
   an implantation region located within the semiconductor substrate at a position disposed between the plurality of photodetectors and the back-side of the semiconductor substrate and separated from the plurality of photodetectors, wherein the implantation region comprises a non-uniform doping concentration that continuously extends below the plurality of photodetectors along a lateral plane parallel to the back-side of the semiconductor substrate.

10. The BSI CSI of claim 9, wherein the implantation region has a second non-uniform doping concentration along a vertical plane perpendicular to the lateral plane.

11. The BSI CSI of claim 10, wherein the non-uniform doping concentration of the implantation region decreases as a function of radial distance from a center of the implantation region along the lateral plane and along the vertical plane.

12. The BSI CSI of claim 9,
   wherein the semiconductor substrate has a first doping type; and
   wherein the implantation region has a second doping type that is different than the first doping type.

13. The BSI CSI of claim 12, wherein the first doping type comprises a p-type dopant and wherein the second doping type comprises an n-type dopant.

14. The BSI CSI of claim 9, wherein the plurality of photodetectors are separated from the back-side of the semiconductor substrate by material of the semiconductor substrate having a thickness variation that is less than or equal to approximately 0.05 μm.

15. A back-side illuminated CMOS image sensor (BSI CSI), comprising:
 a semiconductor substrate having a front-side and a back-side;
 a plurality of photodetectors comprised within the front-side of the semiconductor substrate; and
 an implantation region that continually extends below the plurality of photodetectors at a position vertically disposed between the plurality of photodetectors and the back-side of the semiconductor substrate, wherein the implantation region has a non-uniform doping concentration that decreases as a function of radial distance from a center of the implantation region along a lateral plane parallel to the back-side of the semiconductor substrate.

16. The BSI CSI of claim 15, wherein the implantation region is separated from the plurality of photodetectors.

17. The BSI CSI of claim 15, wherein the implantation region has a second non-uniform doping concentration along a vertical plane perpendicular to the lateral plane.

18. The BSI CSI of claim 15, wherein the plurality of photodetectors comprise pinned photodiodes.

19. The BSI CSI of claim 15, wherein the plurality of photodetectors are separated from the back-side of the semiconductor substrate by material of the semiconductor substrate having a thickness variation that is less than or equal to approximately 0.05 μm.

20. The BSI CSI of claim 15, wherein the non-uniform doping concentration of the implantation region has a Gaussian distribution along the lateral plane.

* * * * *